(12) United States Patent
Narita

(10) Patent No.: US 11,152,469 B2
(45) Date of Patent: Oct. 19, 2021

(54) SEMICONDUCTOR DEVICE

(71) Applicant: FUJI ELECTRIC CO., LTD., Kawasaki (JP)

(72) Inventor: Syunki Narita, Matsumoto (JP)

(73) Assignee: FUJI ELECTRIC CO., LTD., Kawasaki (JP)

(*) Notice: Subject to any disclaimer, the term of this patent is extended or adjusted under 35 U.S.C. 154(b) by 0 days.

(21) Appl. No.: 16/803,355

(22) Filed: Feb. 27, 2020

(65) Prior Publication Data

US 2020/0403066 A1    Dec. 24, 2020

(30) Foreign Application Priority Data

Jun. 21, 2019   (JP) .............................. JP2019-115771

(51) Int. Cl.
| | |
|---|---|
| *H01L 29/10* | (2006.01) |
| *H01L 29/06* | (2006.01) |
| *H01L 29/16* | (2006.01) |
| *H01L 29/78* | (2006.01) |
| *H01L 29/739* | (2006.01) |
| *H01L 29/423* | (2006.01) |

(52) U.S. Cl.
CPC ...... *H01L 29/1095* (2013.01); *H01L 29/0696* (2013.01); *H01L 29/1608* (2013.01); *H01L 29/4236* (2013.01); *H01L 29/7397* (2013.01); *H01L 29/7813* (2013.01)

(58) Field of Classification Search
CPC ............. H01L 29/1095; H01L 29/0696; H01L 29/1608; H01L 29/7813; H01L 29/7397; H01L 29/4236; H01L 29/66068; H01L 29/0878; H01L 29/0623; H01L 29/7375; H01L 29/7393–7395; H01L 29/66325; H01L 29/66333–66348

See application file for complete search history.

(56) References Cited

U.S. PATENT DOCUMENTS

| | | | |
|---|---|---|---|
| 10,593,813 B2 * | 3/2020 | Blanchard | ............... H01L 29/04 |
| 2018/0033876 A1 | 2/2018 | Sugahara et al. | |
| 2018/0040687 A1 * | 2/2018 | Araoka | ............... H01L 29/0878 |

FOREIGN PATENT DOCUMENTS

| | | |
|---|---|---|
| JP | 2017-50516 A | 3/2017 |
| JP | 2018-19046 A | 2/2018 |

* cited by examiner

*Primary Examiner* — Cuong B Nguyen

(57) ABSTRACT

A silicon carbide semiconductor device includes a semiconductor substrate of a first conductivity type, a first semiconductor layer of the first conductivity type, a second semiconductor layer of a second conductivity type, first semiconductor regions of the first conductivity type, first base regions of the second conductivity type, second base regions of the second conductivity type, gate insulating films, gate electrodes, a first electrode, a second electrode, and trenches. Between the trenches, the first base regions are in contact with the second semiconductor layer. The second base regions are provided at positions facing the trenches in a depth direction, respectively, and have a first surface facing the second electrode and a second surface facing the first electrode, where a curvature of the first surface is smaller than a curvature of the second surface.

6 Claims, 7 Drawing Sheets

SEMICONDUCTOR DEVICE

CROSS REFERENCE TO RELATED APPLICATIONS

This application is based upon and claims the benefit of priority of the prior Japanese Patent Application No. 2019-115771, filed on Jun. 21, 2019, the entire contents of which are incorporated herein by reference.

BACKGROUND

1. Field

Embodiments of the invention relate to a semiconductor device.

2. Description of Related Art

Silicon (Si) is used as a material for power semiconductor devices that control high voltage and/or large current. There are several types of power semiconductor devices such as bipolar transistors, insulated gate bipolar transistors (IGBTs), and metal oxide semiconductor field effect transistors (MOSFETs). These devices are selectively used according to an intended purpose.

For example, bipolar transistors and IGBTs have high current density compared to MOSFETs, and can be adapted for large current but cannot be switched at high speeds. In particular, the limit of switching frequency is about several kHz for bipolar transistors and about several tens of kHz for IGBTs. On the other hand, power MOSFETs have low current density compared to bipolar transistors and IGBTs, and are difficult to adapt for large current but can be switched at high speeds up to about several MHz.

There is a strong demand in the market for large-current, high-speed power semiconductor devices. Thus, IGBTs and power MOSFETs have been intensively developed and improved, and the performance of power devices has substantially reached the theoretical limit determined by the material. In terms of power semiconductor devices, semiconductor materials to replace silicon have been investigated and silicon carbide (SiC) has been focused on as a semiconductor material enabling fabrication (manufacture) of a next-generation power semiconductor device having low ON voltage, high-speed characteristics, and high-temperature characteristics.

SiC is a very stable material chemically, has a wide bandgap of 3 eV, and can be used very stably as a semiconductor material even at high temperatures. Further, SiC has a critical electric field strength that is ten times that of silicon or greater, and has a high possibility of exceeding the material limit of silicon. Therefore, future growth is strongly expected for power semiconductor applications, particularly MOSFETs. In particular, ON resistance thereof is expected to be small. Vertical SiC-MOSFETs having even lower ON resistance while maintaining high voltage characteristics can be expected.

A structure of a conventional silicon carbide semiconductor device will be described taking a vertical MOSFET as an example. FIG. 9 is a cross-sectional view of a structure of a conventional trench-type silicon carbide semiconductor device. FIG. 9 is an example of a trench-type MOSFET 150. As depicted in FIG. 9, an $n^-$-type silicon carbide epitaxial layer 102 is deposited on a front surface of an $n^+$-type silicon carbide substrate 101 and on a surface of the $n^-$-type silicon carbide epitaxial layer 102, an n-type high-concentration region 105 and a p-type base layer 106 are deposited.

In an upper layer portion of the p-type base layer 106, $n^+$-type source regions 107 and $p^+$-type contact regions 108 are provided. The $n^+$-type source regions 107 are respectively disposed on both sides of a trench gate structure described hereinafter and the $p^+$-type contact regions 108 are provided facing the trench gate structure, across the $n^+$-type source regions 107, respectively.

Further, a trench 116 is provided penetrating through the p-type base layer 106 and the $n^+$-type source regions 107. The $n^+$-type source regions 107 are disposed so as to be in contact with side walls of the trench 116.

An inner wall of the trench 116 is covered by a gate insulating film 109 that is configured by an oxide film or the like and the trench 116 is embedded with a gate electrode 110 formed on a surface of the gate insulating film 109. The trench gate structure is configured in this manner.

In such a trench gate structure, to protect the gate insulating film 109 at a bottom of the trench 116, in a surface layer of the n-type high-concentration region 105 on a first side of the n-type high-concentration region 105, opposite a second side of the n-type high-concentration region 105 facing the $n^+$-type silicon carbide substrate 101, a first $p^+$-type base region 103 is provided and a second $p^+$-type base region 104 is provided in the n-type high-concentration region 105 so as to be in contact with the bottom of the trench 116. For example, in Japanese Laid-Open Patent Publication No. 2017-50516, the second $p^+$-type base region 104 is provided in a trapezoidal shape having right angles on an upper side and rounded on a lower side. Further, in Japanese Laid-Open Patent Publication No. 2018-19046, impurity concentrations of the first $p^+$-type base region 103 and the second $p^+$-type base region 104 in a depth direction are equal and the second $p^+$-type base region 104 is shallower than the first $p^+$-type base region 103.

Provision of the first $p^+$-type base region 103 and the second $p^+$-type base region 104 enables a pn junction between the first $p^+$-type base region 103, the second $p^+$-type base region 104, and the n-type high-concentration region 105 to be formed at a position near the bottom of the trench 116 in the depth direction. In this manner, the pn junction between the first $p^+$-type base region 103, the second $p^+$-type base region 104, and the n-type high-concentration region 105 is formed, whereby an application of high electric field to the gate insulating film 109 at the bottom of the trench 116 may be prevented. Therefore, even when a wide bandgap semiconductor is used as a semiconductor material, high breakdown voltage is possible.

Further, an $n^+$-type region 117 is provided at a position deeper than that of the first $p^+$-type base region 103 that is between the trench 116 and another trench 116. On surfaces of the p-type base layer 106 and the $n^+$-type source regions 107 and a surface of the gate electrode 110, a source electrode 112 is provided on an interlayer insulating film 111. The source electrode 112 is electrically connected to the $p^+$-type contact regions 108 and the $n^+$-type source regions 107 through contact holes formed in the interlayer insulating film 111. A barrier metal 114 is provided between the source electrode 112 and the interlayer insulating film 111.

Further, a back electrode (drain electrode) 113 that is electrically connected to the $n^+$-type silicon carbide substrate 101 is formed on a back surface of the $n^+$-type silicon carbide substrate 101. A MOSFET having an inversion-type trench gate structure of an n-channel type is configured by such a structure.

SUMMARY

According to an embodiment of the invention, a semiconductor device includes a semiconductor substrate of a first conductivity type; a first semiconductor layer of the first conductivity type, provided on a front surface of the semiconductor substrate, and having an impurity concentration lower than an impurity concentration of the semiconductor substrate, the first semiconductor layer having a first surface and a second surface that is opposite to the first side and faces the front surface of the semiconductor substrate; a second semiconductor layer of a second conductivity type, provided on the first surface of the first semiconductor layer; a first semiconductor region of the first conductivity type, selectively provided in a surface layer of the second semiconductor layer; a plurality of trenches penetrating the first semiconductor region and the second semiconductor layer, and reaching the first semiconductor layer; a plurality of gate electrodes each provided in a corresponding trench of the plurality of trenches, via a gate insulating film; a first base region of the second conductivity type, provided in the first semiconductor layer, between adjacent trenches of the plurality of trenches, the first base region being in contact with the second semiconductor layer; a plurality of second base regions of the second conductivity type, provided in the first semiconductor layer, second base regions of the plurality of second base regions facing trenches of the plurality of trenches, respectively, in a depth direction; a first electrode in contact with the first semiconductor region and the second semiconductor layer; and a second electrode provided on a back surface of the semiconductor substrate. Each of the plurality of second base regions has a first surface facing the second electrode and a second surface facing the first electrode, and a curvature of the first surface is smaller than a curvature of the second surface.

In the embodiment, a depth of a portion of the first base region where a width of the first base region is greatest and a depth of a portion of the each of the plurality of second base regions where a width of the each of the plurality of second base regions is greatest are equal.

In the embodiment, a distance between the second surface of one of the plurality of second base regions and the second semiconductor layer is less than a distance between the first base region and the one of the plurality of second base regions.

In the embodiment, the first base region has a surface that faces the second electrode, and the curvature of the first surface of the each of the plurality of second base regions is smaller than a curvature of the surface of the first base region.

In the embodiment, the semiconductor device further includes a third semiconductor layer of the first conductivity type, provided in a surface layer of the first semiconductor layer, and having an impurity concentration that is higher than the impurity concentration of the first semiconductor layer. The third semiconductor layer includes a first third semiconductor layer that is deeper than the second surface of the each of the plurality of second base regions and a second third semiconductor layer that is shallower than the first surface of the each of the plurality of second base regions. The second third semiconductor layer has an impurity concentration that is lower than an impurity concentration of the first third semiconductor layer.

In the embodiment, the semiconductor device further includes a third semiconductor layer of the first conductivity type, provided in a surface layer of the first semiconductor layer, and having an impurity concentration that is higher than the impurity concentration of the first semiconductor layer. The third semiconductor layer includes a first third semiconductor layer that is deeper than the second surface of the each of the plurality of second base regions and a second third semiconductor layer that is shallower than the first surface of the each of the plurality of second base regions. The first third semiconductor layer has an impurity concentration that is equal to an impurity concentration of the second third semiconductor layer.

Objects, features, and advantages of the present invention are specifically set forth in or will become apparent from the following detailed description of the invention when read in conjunction with the accompanying drawings.

DESCRIPTION OF EMBODIMENTS

Figure 10:
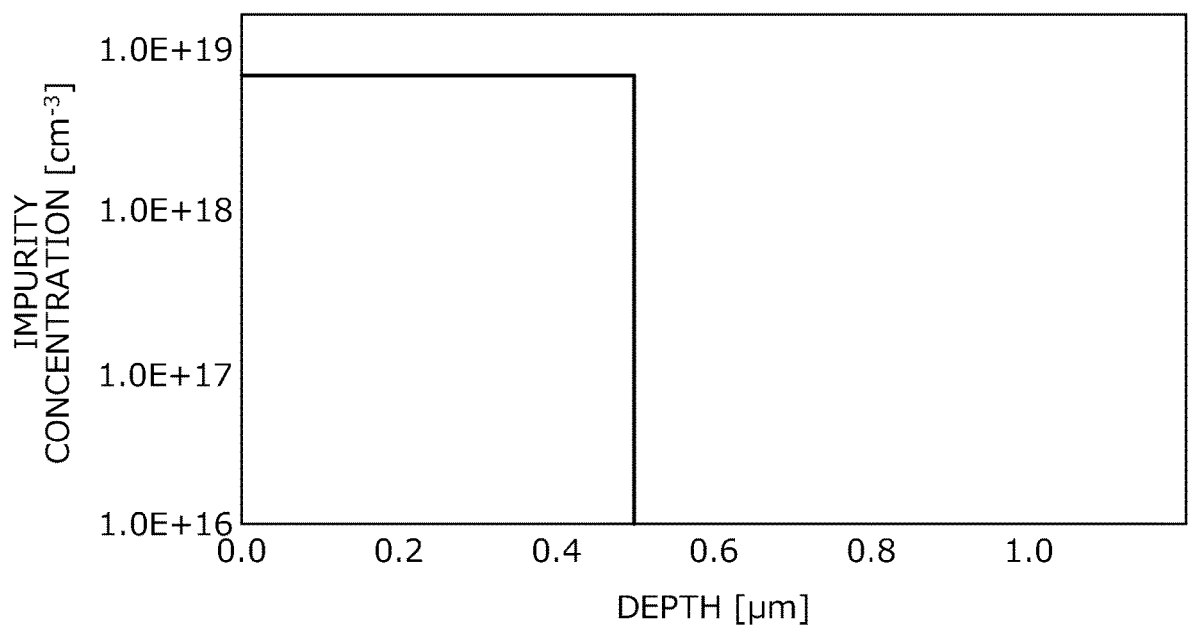
FIG. 10 is a graph depicting a profile of a second $p^+$-type base region of the conventional trench-type silicon carbide semiconductor device.

First, problems associated with the conventional techniques will be discussed. Here, the second $p^+$-type base region 104 is formed having a box profile due to multistage ion implantation. FIG. 10 is a graph depicting a profile of the second $p^+$-type base region of the conventional trench-type silicon carbide semiconductor device. In FIG. 10, a horizontal axis indicates depth from the bottom of the trench 116 in units of μm. A vertical axis indicates impurity concentration in units of $cm^{-3}$. As depicted FIG. 10, in the depth direction, the impurity concentration has a uniform box profile. In particular, in a region (the second $p^+$-type base region 104) from the bottom of the trench 116 to about 0.5 μm, the impurity concentration is substantially constant and the impurity concentration is substantially zero beyond 0.5 μm.

In such a box profile, when the gate is ON and voltage Vds is applied between a drain and a source, electrons cannot go beyond a depletion layer and reach the second $p^+$-type base region 104 and thus, current flows along corners of the second p+-type base region 104. Therefore, when the gate is ON, a current path becomes longer and spreading resistance increases. As a result, a problem arises in that device loss increases.

On the other hand, when the gate is OFF and voltage Vds is applied between the drain and the source, electric field lines have a tendency to concentrate at corners and thus, electric field concentrates at the corners of the second p+-type base region 104. Therefore, a problem arises in that avalanche breakdown occurs in the second p+-type base region 104 at the bottom of the trench 116 and the gate insulating film 109 at the trench 116 may be destroyed.

Embodiments of a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described. Further, in the present description, when Miller indices are described, "−" means a bar added to an index immediately after the "−", and a negative index is expressed by prefixing "−" to the index. With consideration of variation in manufacturing, in description the same or equal includes within 5%.

Figure 1:
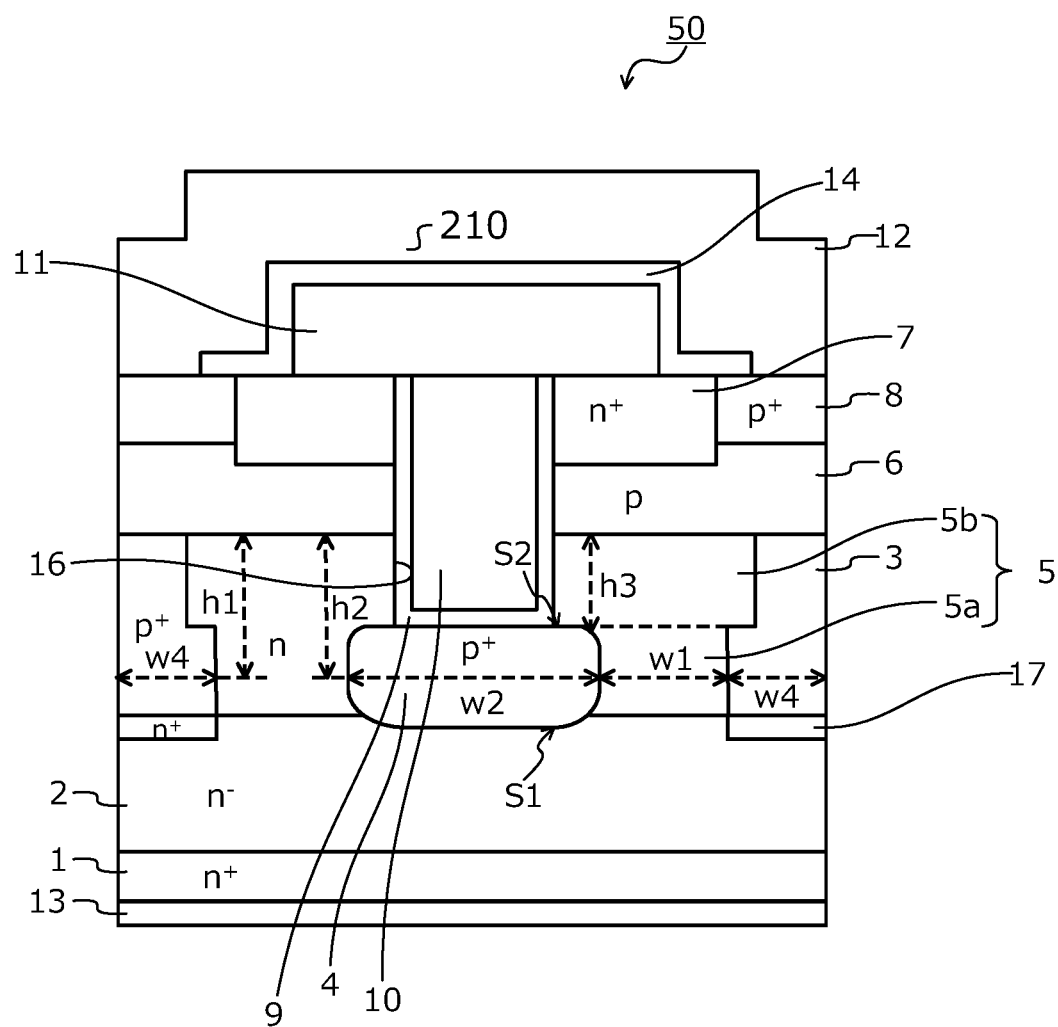
FIG. 1 is a cross-sectional view of a structure of a silicon carbide semiconductor device according to an embodiment.
Figure 2:
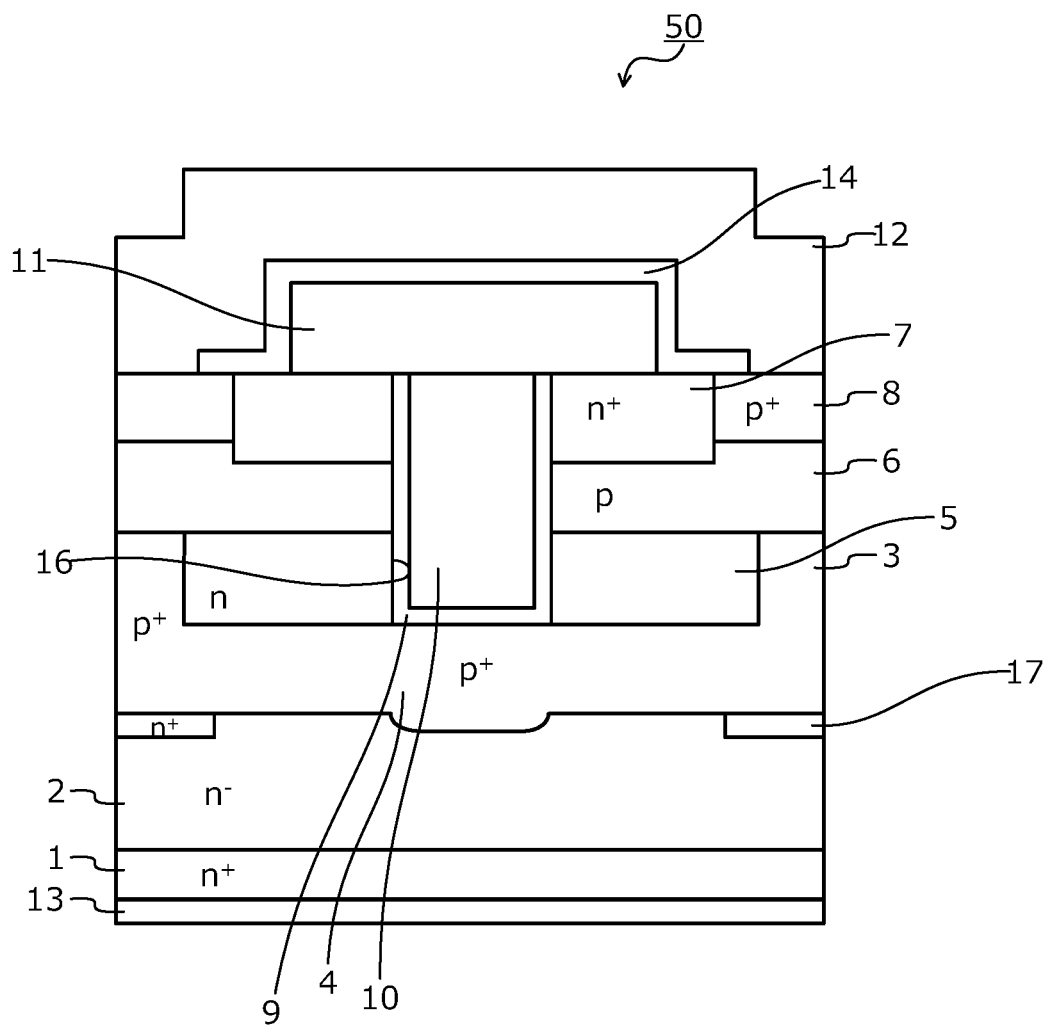
FIG. 2 is a cross-sectional view of the structure of the silicon carbide semiconductor device according to the embodiment.

The semiconductor device according to the present invention is configured using a wide bandgap semiconductor. In an embodiment, a MOSFET will be described as an example of a silicon carbide semiconductor device fabricated using, for example, silicon carbide (SiC) as the wide bandgap semiconductor. FIGS. 1 and 2 are cross-sectional views of a structure of the silicon carbide semiconductor device according to the embodiment. FIGS. 1 and 2 depict an example of a trench-type MOSFET 50.

As depicted in FIGS. 1 and 2, in the silicon carbide semiconductor device according to the embodiment, on a first main surface (front surface), for example, a (0001) plane (Si-face) of an n+-type silicon carbide substrate (semiconductor substrate of a first conductivity type) 1, an n−-type silicon carbide epitaxial layer (first semiconductor layer of the first conductivity type) 2 is deposited.

The n+-type silicon carbide substrate 1 is a silicon carbide single crystal substrate. The n−-type silicon carbide epitaxial layer 2 has an impurity concentration that is lower than an impurity concentration of the n+-type silicon carbide substrate 1 and, for example, is a low-concentration n-type drift layer. The n−-type silicon carbide epitaxial layer 2 has a first side and a second side that is opposite to the first side and faces the n+-type silicon carbide substrate 1. On a surface on the first side of the n−-type silicon carbide epitaxial layer 2, an n-type high-concentration region (third semiconductor layer of the first conductivity type) 5 may be provided. The n-type high-concentration region 5 is a high-concentration n-type drift layer having an impurity concentration that is lower than the impurity concentration of the n+-type silicon carbide substrate 1 and higher than the impurity concentration of the n−-type silicon carbide epitaxial layer 2.

On the surface of the first side of the n−-type silicon carbide epitaxial layer 2, a p-type base layer (second semiconductor layer of a second conductivity type) 6 is provided. Hereinafter, the n+-type silicon carbide substrate 1, the n−-type silicon carbide epitaxial layer 2, the n-type high-concentration region 5, and the p-type base layer 6 collectively form a silicon carbide semiconductor base.

On a second main surface (back surface, i.e., back surface of the silicon carbide semiconductor base) of the n+-type silicon carbide substrate 1, a drain electrode forming a back electrode (second electrode) 13 is provided. On a surface of the back electrode 13, a drain electrode pad (not depicted) is provided.

On a first side (side having the p-type base layer 6) of the silicon carbide semiconductor base, a trench structure is formed. In particular, a trench 16 penetrates through the p-type base layer 6 from a surface of the p-type base layer 6 on a first side (the first side of the silicon carbide semiconductor base) of the p-type base layer 6 opposite a second side of the p-type base layer 6 facing the n+-type silicon carbide substrate 1 and reaches the n-type high-concentration region 5 (when the n-type high-concentration region 5 is not provided, the n−-type silicon carbide epitaxial layer 2, hereinafter simply "(2)"). Along an inner wall of the trench 16, a gate insulating film 9 is formed on a bottom and side walls of the trench 16, a gate electrode 10 is formed on the gate insulating film 9 in the trench 16. The gate electrode 10 is insulated from the n-type high-concentration region 5 (2) and the p-type base layer 6 by the gate insulating film 9. A portion of the gate electrode 10 may protrude from a top (side where a source electrode (first electrode) 12 described hereinafter is provided) of the trench 16 toward the source electrode 12.

In a surface layer of the n-type high-concentration region 5 (2) on a first side (the first side of the silicon carbide semiconductor base) of the n-type high-concentration region 5 (2) opposite a second side of the n-type high-concentration region 5 (2) facing the n+-type silicon carbide substrate 1, a first p+-type base region (first base region of the second conductivity type) 3 is provided between the trench 16 and another trench 16. Further, a second p+-type base region (second base region of the second conductivity type) 4 that is in contact with a bottom of the trench 16 is provided in the n-type high-concentration region 5 (2). The second p+-type base region 4 is provided positioned facing the bottom of the trench 16 in the depth direction (direction from the source electrode 12 toward the back electrode). The second p+-type base region 4 has a width that is wider than a width of the trench 16. The bottom of the trench 16 may reach the second p+-type base region 4 or may be positioned in the n-type high-concentration region 5 (2), between the p-type base layer 6 and the second p+-type base region 4.

Provision of the first p+-type base region 3 and the second p+-type base region 4 enables a pn junction between the first p+-type base region 3, the second p+-type base region 4, and the n-type high-concentration region 5 (2) to be formed at a position near the bottom of the trench 16 in the depth direction. In this manner, a pn junction between the first p+-type base region 3, the second p+-type base region 4, and the n-type high-concentration region 5 (2) is formed, whereby application of high electric field to the gate insulating film 9 at the bottom of the trench 16 may be prevented. Therefore, even when a wide bandgap semiconductor is used as a semiconductor material, high breakdown voltage is possible.

Further, a portion of the first p+-type base region 3 extends toward the trench 16, thereby forming a structure in which the first p+-type base region 3 is connected to the second p+-type base region 4. As a result, electric potential of the first p+-type base region 3 and the second p+-type base region 4 is shared and stabilized. FIG. 1 depicts a cross-sectional view of a portion where the first p+-type base region 3 does not partially extend toward the trench 16. FIG.

2 depicts a cross-sectional view of a portion where the first p$^+$-type base region 3 partially extends toward the trench 16.

In the embodiment, an n$^+$-type region 17 having a peak impurity concentration that is higher than a peak impurity concentration of the n-type high-concentration region 5 (2) is provided in the n$^-$-type silicon carbide epitaxial layer 2, at a position deeper than is the first p$^+$-type base region 3 that is between the trench 16 and another trench 16. A deep position is a position closer to the back electrode 13 than is the first p$^+$-type base region 3. The peak impurity concentration of the n$^+$-type region 17 suffices to be higher than the impurity concentration of the n-type high-concentration region 5 (2) and the impurity concentration the n$^+$-type region 17 needs not be higher than that of the n-type high-concentration region 5 (2) throughout the n$^+$-type region 17. Further, in a case in which the n-type high-concentration region 5 is not provided, the peak impurity concentration of the n$^+$-type region 17 is higher than the impurity concentration of the n$^-$-type silicon carbide epitaxial layer 2.

Due to the n$^+$-type region 17, a portion that determines the breakdown voltage of an element may be set to be the first p$^+$-type base region 3 between the trench 16 and another trench 16 and not the second p$^+$-type base region 4 at the bottom of the trench 16. In other words, the breakdown voltage of the second p$^+$-type base region 4 at the bottom of the trench 16 may be set to be higher than the breakdown voltage of the first p$^+$-type base region 3 between the trench 16 and another trench 16.

Further, the n$^+$-type region 17 may be provided beneath (direction from the source electrode 12 toward the back electrode 13) a portion of the first p$^+$-type base region 3. In this case, the position where electric field concentrates may be controlled. Further, compared to a case in which the n$^+$-type region 17 is provided beneath the first p$^+$-type base region 3 entirely, the same effect may be obtained by a smaller nitrogen dose amount and since the dose amount is reduced, the number of ion implantation stages may be reduced.

In the p-type base layer 6, an n$^+$-type source region (first semiconductor region of the first conductivity type) 7 is selectively provided on the first side of the silicon carbide semiconductor base. A p$^+$-type contact region 8 may be selectively provided. Further, the n$^+$-type source region 7 and the p$^+$-type contact region 8 are in contact with each other.

An interlayer insulating film 11 is provided so as to span the first side of the silicon carbide semiconductor base entirely and cover the gate electrode 10 embedded in the trench 16. The source electrode 12 is in contact with the n$^-$-type source region 7 and the p-type base layer 6 through contact holes opened in the interlayer insulating film 11. Further, when the p$^+$-type contact region 8 is provided, the source electrode 12 is in contact with the n$^+$-type source region 7 and the p$^+$-type contact region 8. The source electrode 12 is electrically insulated from the gate electrode 10 by the interlayer insulating film 11. A source electrode pad (not depicted) is provided on the source electrode 12. Between the source electrode 12 and the interlayer insulating film 11, for example, a barrier metal 14 that contains, for example, titanium or titanium nitride and prevents hydrogen from entering or metal atoms from diffusing from the source electrode 12 toward the gate electrode 10 may be provided.

In FIGS. 1 and 2, while only one cell (structure formed by the trench 16, the gate insulating film 9, the gate electrode 10, the interlayer insulating film 11, and the source electrode 12) is depicted and described, further MOS gate (insulated gate formed by a metal, oxide film, and semiconductor) structures of many cells may be disposed in parallel.

In the embodiment, as depicted in FIG. 1, in the second p$^+$-type base region 4, curvature of a surface S1 (lower surface thereof) facing the back electrode 13 is smaller than curvature of a surface S2 (upper surface thereof) facing the source electrode 12. For example, the curvature (curvature=1/r (radius)) of lower surface is in a range from 1.30 to 2.42, the curvature of the upper surface is in a range from 3.05 to 5.54, and the curvature of the upper surface may be in a range from 1.8 times to 2.9 times the curvature of the lower surface. As a result, an outlet side of the current path when the gate is ON and voltage Vds is applied between the drain and the source and current flows may be widened. Therefore, spreading resistance may be reduced, enabling device loss to be reduced.

Further, when the gate is OFF and voltage Vds is applied between the drain and the source, a bottom part of the second p$^+$-type base region 4 has no corner and therefore, concentration of electric field at a bottom of the second p$^+$-type base region 4 may be mitigated, enabling avalanche breakdown voltage of the second p$^+$-type base region 4 to be increased. Therefore, the occurrence of avalanche breakdown at the bottom of the trench 16 and destruction of the gate insulating film 9 at the bottom of the trench 16 may be prevented.

Further, as depicted in FIG. 1, a depth h1 of a portion of the first p$^+$-type base region 3 where a width w4 is widest and a depth h2 of a portion of the second p$^+$-type base region 4 where a width w2 is widest may be about equal (h1≈h2). Here, a depth is a length from an interface between the n-type high-concentration region 5 (2) and the p-type base layer 6, in direction toward the back electrode 13. A width the first p$^+$-type base region 3 is a dimension of the first p$^+$-type base region 3 in a direction along which the first p$^+$-type base region 3 disposed in plural and a width of the second p$^+$-type base region 4 is a dimension of the second p$^+$-type base region 4 in the direction along which the first p$^+$-type base region 3 is disposed in plural. As a result, the spreading resistance is suppressed and when large current flows (during a short circuit) and a junction field effect transistor (JFET) region closes, the JFET region closes at the same depth and therefore, short circuit capability may be increased.

Further, a depth h3 of the JFET region at a channel outlet thereof may be smaller than a width w1 of the JFET region between the first p$^+$-type base region 3 and the second p$^+$-type base region 4 (h3<w1). The depth h3 of the JFET region at the channel outlet is a distance between the p-type base layer 6 and the surface S2 of the second p$^+$-type base region 4 on the side of the second p$^+$-type base region 4 facing the source electrode 12. As a result, the short circuit capability may be further increased. Furthermore, when the depth h3 of the JFET region at the channel outlet decreases, the ON resistance increases and therefore, h3, for example, may be in a range from 0.6 times to 0.8 times w1.

Further, the curvature of the surface S1 of the second p$^+$-type base region 4 on the side of the second p$^+$-type base region 4 facing the back electrode 13 may be smaller than the curvature of the first p$^+$-type base region 3 on the side of the first p$^+$-type base region 3 facing the back electrode 13. As a result, electric field may be concentrated at the bottom of the first p$^+$-type base region 3 to a greater extent than at the bottom of the second p$^+$-type base region 4, whereby concentration of electric field at the bottom of the second p$^+$-type base region 4 may be mitigated.

Further, the n-type high-concentration region 5 is formed by a lower n-type high-concentration region (first third semiconductor layer) 5a from the surface S1 of the second p$^+$-type base region 4 facing the back electrode 13 to the surface S2 of the second p$^+$-type base region 4 facing the source electrode 12 and an upper n-type high-concentration region (second third semiconductor layer) 5b from the surface S2 of the second p$^+$-type base region 4 facing the source electrode 12 to the p-type base layer 6. An impurity concentration of the upper n-type high-concentration region 5b may be lower than an impurity concentration of the lower n-type high-concentration region 5a. As a result, resistance of the JFET region at the channel outlet is smaller than resistance of the JFET region between the first p$^+$-type base region 3 and the second p$^+$-type base region 4, whereby the short circuit capability may be enhanced.

Here, the impurity concentration of the lower n-type high-concentration region 5a is higher than the impurity concentration of the n$^-$-type silicon carbide epitaxial layer 2 and therefore, the impurity concentration of the upper n-type high-concentration region 5b may be reduced. For example, the impurity concentration of the lower n-type high-concentration region 5a may be in a range from 1 time to 100 times greater than the impurity concentration of the upper n-type high-concentration region 5b. Further, the impurity concentration of the lower n-type high-concentration region 5a may be in a range from 10 times to 100 times greater than the impurity concentration of the n$^-$-type silicon carbide epitaxial layer 2.

Further, the impurity concentration of the lower n-type high-concentration region 5a and the impurity concentration of the upper n-type high-concentration region 5b may be equal. In this case, spreading of the depletion layer may be made uniform and the ON resistance may be reduced.

Further, at the bottom of the trench 16, the width of the second p$^+$-type base region 4 is greater than the width of the trench 16 and therefore, when large voltage is applied at the time of short circuit, resistance is induced by overhanging of the second p$^+$-type base region 4, whereby a tradeoff between the ON resistance and the short circuit capability improves.

A method of manufacturing the silicon carbide semiconductor device according to the embodiment will be described. FIGS. 3, 4, 5, 6, 7, and 8 are cross-sectional views of the silicon carbide semiconductor device according to the embodiment during manufacture.

Figure 3:
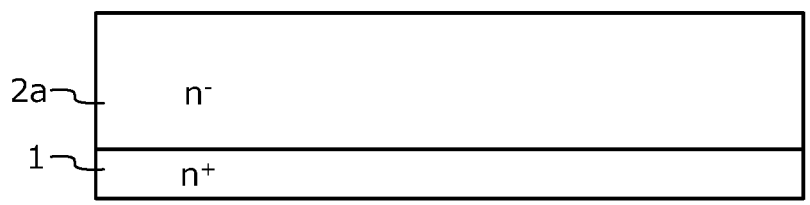
FIG. 3 is a cross-sectional view of the silicon carbide semiconductor device according to the embodiment during manufacture.

First, the n$^+$-type silicon carbide substrate 1 containing silicon carbide of an n-type is prepared. Then, on the first main surface of the n$^+$-type silicon carbide substrate 1, a first n$^-$-type silicon carbide epitaxial layer 2a containing silicon carbide is formed by epitaxial growth to have a thickness of, for example, about 30 μm while an n-type impurity, for example, nitrogen atoms (N) is doped. The state up to here is depicted in FIG. 3.

Next, on a surface of the first n$^-$-type silicon carbide epitaxial layer 2a, a non-depicted mask having predetermined openings is formed by a photolithography technique using, for example, an oxide film. Then, by an ion implantation using this oxide film as a mask, an n-type impurity, for example, nitrogen atoms may be ion implanted. As a result, in the first n$^-$-type silicon carbide epitaxial layer 2a, the n$^+$-type regions 17 are formed.

Next, the mask used during the ion implantation for forming the n$^+$-type regions 17 is removed. Next, on the surface of the first n$^-$-type silicon carbide epitaxial layer 2a, an ion implantation mask having predetermined openings is formed by a photolithography technique, for example, using an oxide film. Then, a p-type impurity such as aluminum is implanted in the openings of the oxide film and at a depth of about 0.5 μm, lower first p$^+$-type base regions 3a and the second p$^+$-type base regions 4 are formed. On a surface of each of the n$^+$-type regions 17, on a first side of the n$^+$-type regions 17 opposite a second side of the n$^+$-type regions 17 facing the n$^+$-type silicon carbide substrate 1 when the n$^+$-type regions 17 are formed, the lower first p$^+$-type base regions 3a are formed so as to overlap the n$^+$-type regions 17, respectively.

Here, by adjustment of the number of stages of the ion implantation and an ion implantation amount of each stage, a shape of the second p$^+$-type base regions 4 is formed so that the curvature of the lower surface is smaller than the curvature of the upper surface. For example, in the conventional silicon carbide semiconductor device, the second p$^+$-type base region 104 is formed having a box profile by a seven-stage ion implantation, however, in the embodiment, the curvature of the lower surface is formed to be smaller than the curvature of the upper surface by a three-stage or a four-stage ion implantation. Further, in a lower part of each the lower first p$^+$-type base regions 3a, the n$^+$-type regions 17 are formed and therefore, spreading of implanted ions is suppressed by the n$^-$-type regions 17. Thus, the curvature of the lower surface of the second p$^+$-type base regions 4 is smaller than the curvature of the lower surface of the lower first p$^+$-type base regions 3a. Further, formation is such that a distance between the lower first p$^+$-type base region 3a and the second p$^+$-type base region 4 that are adjacent to each other is about 1.5 μm. Impurity concentrations of the lower first p$^+$-type base regions 3a and the second p$^+$-type base regions 4, for example, are set to be about $5 \times 10^{18}/cm^3$.

Figure 4:
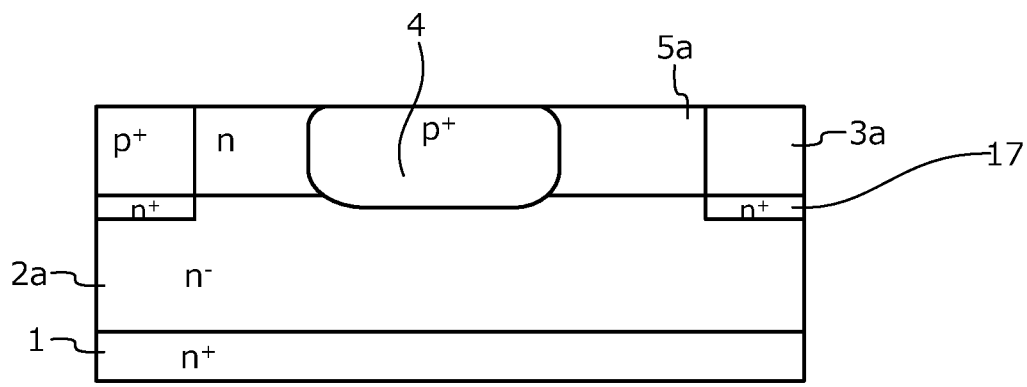
FIG. 4 is a cross-sectional view of the silicon carbide semiconductor device according to the embodiment during manufacture.

Next, portions of the ion implantation mask may be removed and an n-type impurity such as nitrogen may be ion implanted in the openings, whereby the lower n-type high-concentration regions 5a may be formed, for example, at a depth of about 0.5 μm in portions of a surface region of the first n$^-$-type silicon carbide epitaxial layer 2a. An impurity concentration of the lower n-type high-concentration regions 5a, for example, is set to be about $1 \times 10^{17}/cm^3$. The state up to here is depicted in FIG. 4.

Next, on the surface of the first n$^-$-type silicon carbide epitaxial layer 2a, a second n$^-$-type silicon carbide epitaxial layer 2b doped with an n-type impurity such as nitrogen is formed to have a thickness of about 0.5 μm. An impurity concentration of the second n$^-$-type silicon carbide epitaxial layer 2b is set to be about $3 \times 10^{15}/cm^3$. Hereinafter, the first n$^-$-type silicon carbide epitaxial layer 2a and the second n$^-$-type silicon carbide epitaxial layer 2b collectively form the n$^-$-type silicon carbide epitaxial layer 2.

Next, on a surface of the second n$^-$-type silicon carbide epitaxial layer 2b, an ion implantation mask having predetermined openings is formed by photolithography using, for example, an oxide film. Then, a p-type impurity such as aluminum is ion implanted in the openings of the oxide film, thereby forming at a depth of about 0.5 μm, upper first p$^+$-type base regions 3b so as to respectively overlap the lower first p$^+$-type base regions 3a. The lower first p$^+$-type base regions 3a and the upper first p$^+$-type base regions 3b respectively form a continuous region and thereby, form the first p$^+$-type base regions 3. An impurity concentration of the upper first p$^+$-type base regions 3b, for example, is set to be about $5 \times 10^{18}/cm^3$.

Figure 5:
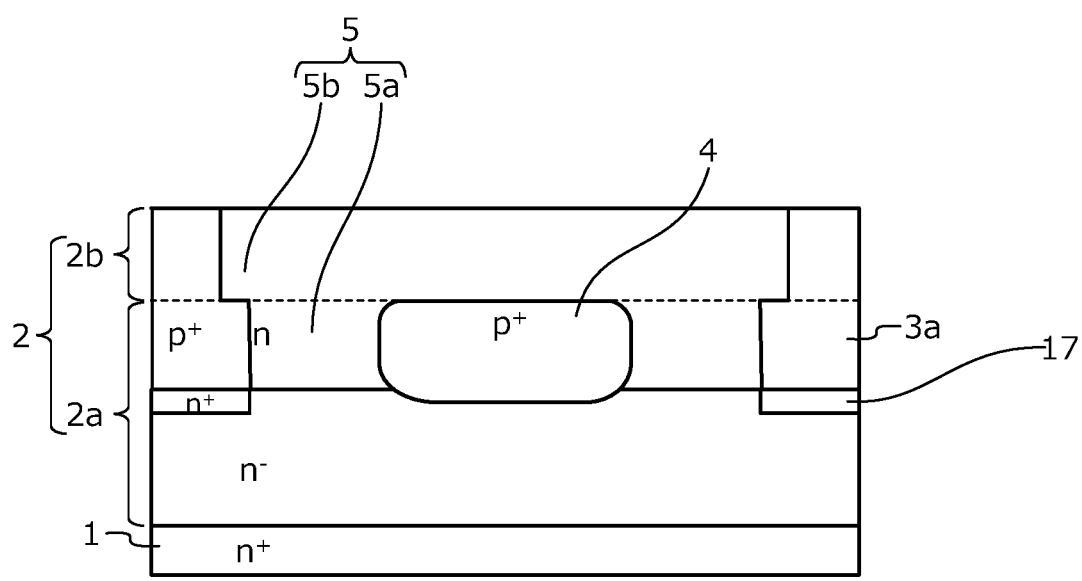
FIG. 5 is a cross-sectional view of the silicon carbide semiconductor device according to the embodiment during manufacture.

Next, portions of the ion implantation mask may be removed, an n-type impurity such as nitrogen may be ion implanted in the openings, and the upper n-type high-concentration region 5b may be formed, for example, at a depth of about 0.5 μm in portions of a surface region of the second n$^-$-type silicon carbide epitaxial layer 2b. An impurity concentration of the upper n-type high-concentration regions 5b, for example, is set to be about $1\times10^{17}/cm^3$. The upper n-type high-concentration regions 5b and the lower n-type high-concentration regions 5a are formed to at least partially contact each other, respectively, and thereby, form the n-type high-concentration regions 5. Nonetheless, the n-type high-concentration region 5 may be formed spanning the substrate entirely or formation of the n-type high-concentration regions 5 may be omitted. The state up to here is depicted in FIG. 5.

Next, on the surface of the n⁻-type silicon carbide epitaxial layer 2, the p-type base layer 6 is formed to have a thickness of about 1.1 μm by epitaxial growth. An impurity concentration of the p-type base layer 6 is set to be about $4\times10^{17}/cm^3$. After formation of the p-type base layer 6 by epitaxial growth, the p-type base layer 6 may be further ion implanted with a p-type impurity such as aluminum.

Figure 6:
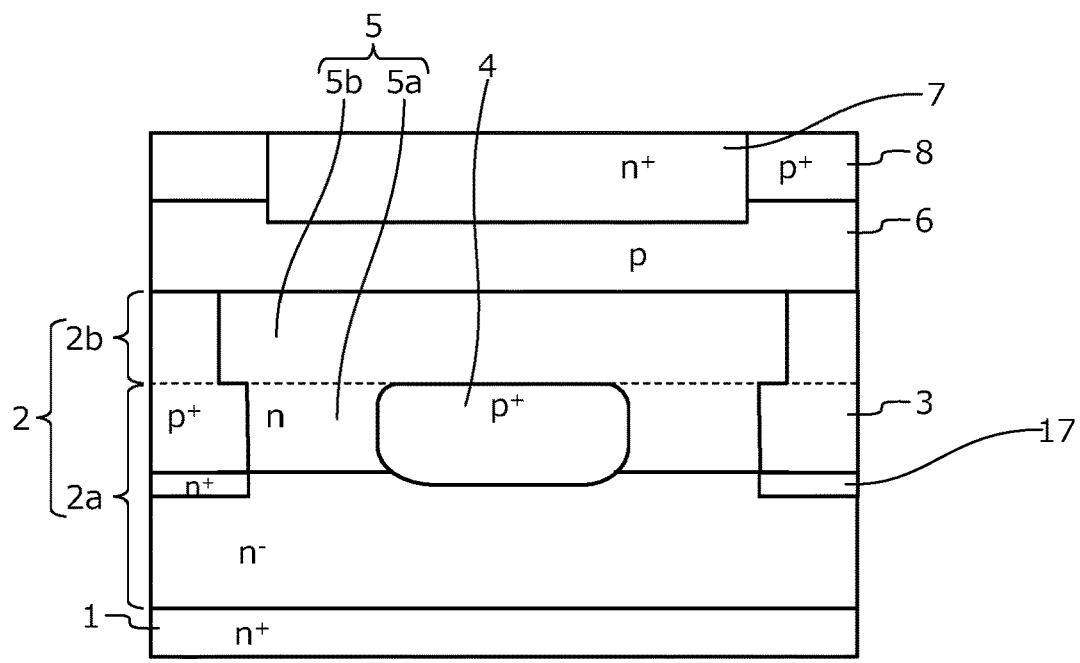
FIG. 6 is a cross-sectional view of the silicon carbide semiconductor device according to the embodiment during manufacture.

Next, on the surface of the p-type base layer 6, an ion implantation mask having predetermined openings is formed by photolithography using, for example, an oxide film. An n-type impurity such as nitrogen (N) or phosphorus (P) is ion implanted in the openings, thereby forming the $n^+$-type source region 7 at portions of the surface of the p-type base layer 6. Next, the ion implantation mask used in the formation of the $n^+$-type source regions 7 is removed and by a similar method, an ion implantation mask having predetermined openings may formed, a p-type impurity such as phosphorus may be ion implanted at portions of the surface of the p-type base layer 6, and the $p^+$-type contact regions 8 may be formed. An impurity concentration of the $p^+$-type contact regions 8 is set to be higher than the impurity concentration the p-type base layer 6. The state up to here is depicted in FIG. 6.

Next, a heat treatment (annealing) in an inert gas atmosphere of about 1700 degrees C. is performed, thereby implementing an activation process of the first $p^+$-type base regions 3, the second $p^+$-type base regions 4, the $n^+$-type source regions 7, the $p^+$-type contact regions 8, and the $n^+$-type regions 17. As described above, ion implanted regions may be collectively activated by a single session of the heat treatment or may be activated by performing the heat treatment each time ion implantation is performed.

Figure 7:
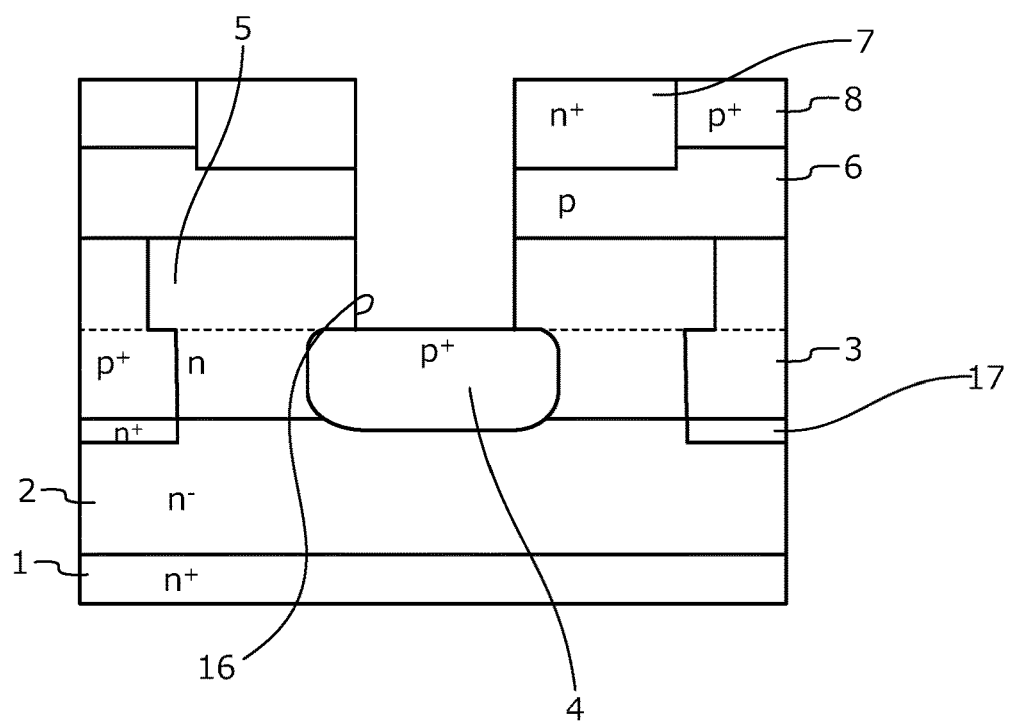
FIG. 7 is a cross-sectional view of the silicon carbide semiconductor device according to the embodiment during manufacture.

Next, on the surface of the p-type base layer 6, a trench formation mask having predetermined openings is formed by photolithography using, for example, an oxide film. Next, by dry etching, the trenches 16 are formed penetrating through the p-type base layer 6 and reaching the n-type high-concentration regions 5 (2). The bottoms of the trenches 16 may respectively reach the second $p^+$-type base regions 4 formed in the n-type high-concentration regions 5 (2). Next, the trench formation mask is removed. The state up to here is depicted in FIG. 7.

Next, on surfaces of the $n^+$-type source regions 7 and along the bottoms and side walls of the trenches 16, the gate insulating film 9 is formed. The gate insulating film 9 may be formed by thermal oxidation of a temperature of about 1000 degrees C. in an oxygen atmosphere. Further, the gate insulating film 9 may be formed by a deposition method through a chemical reaction such as that of a high temperature oxide (HTO).

Next, on the gate insulating film 9, a polycrystalline silicon layer doped with, for example, phosphorus atoms is provided. The polycrystalline silicon layer may be formed so as to be embedded in the trenches 16. The polycrystalline silicon layer is patterned by photolithography and is left in the trenches 16, whereby the gate electrodes 10 are formed.

Figure 8:
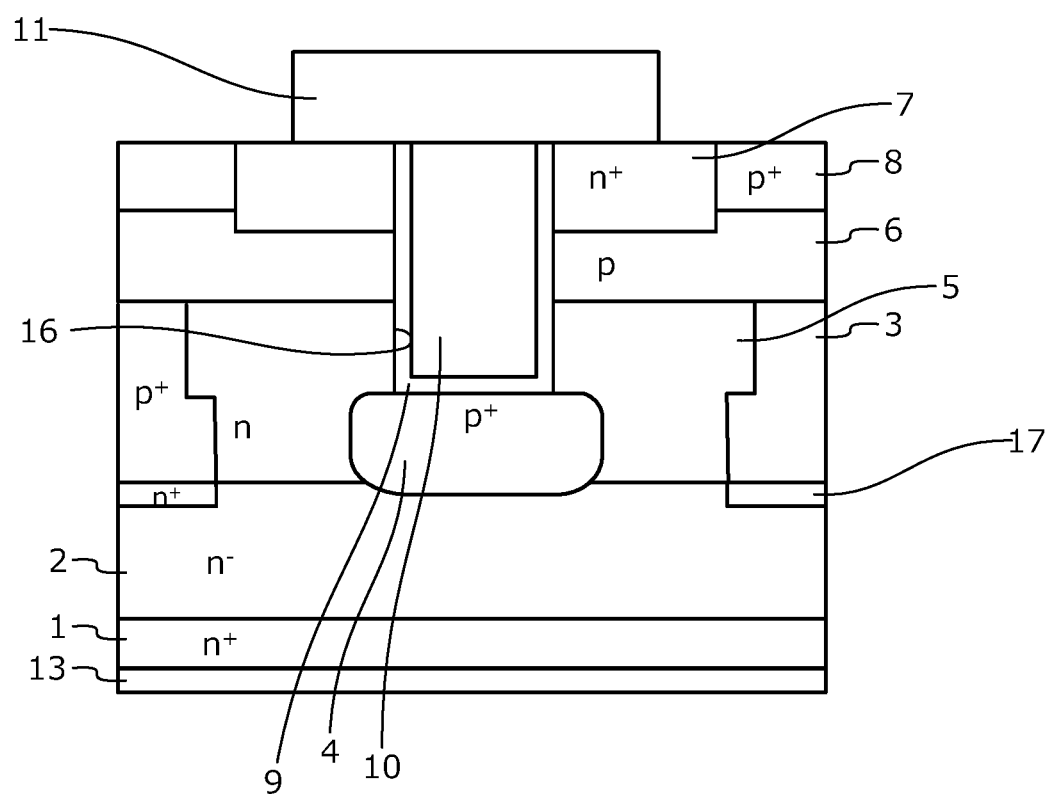
FIG. 8 is a cross-sectional view of the silicon carbide semiconductor device according to the embodiment during manufacture.
Figure 9:
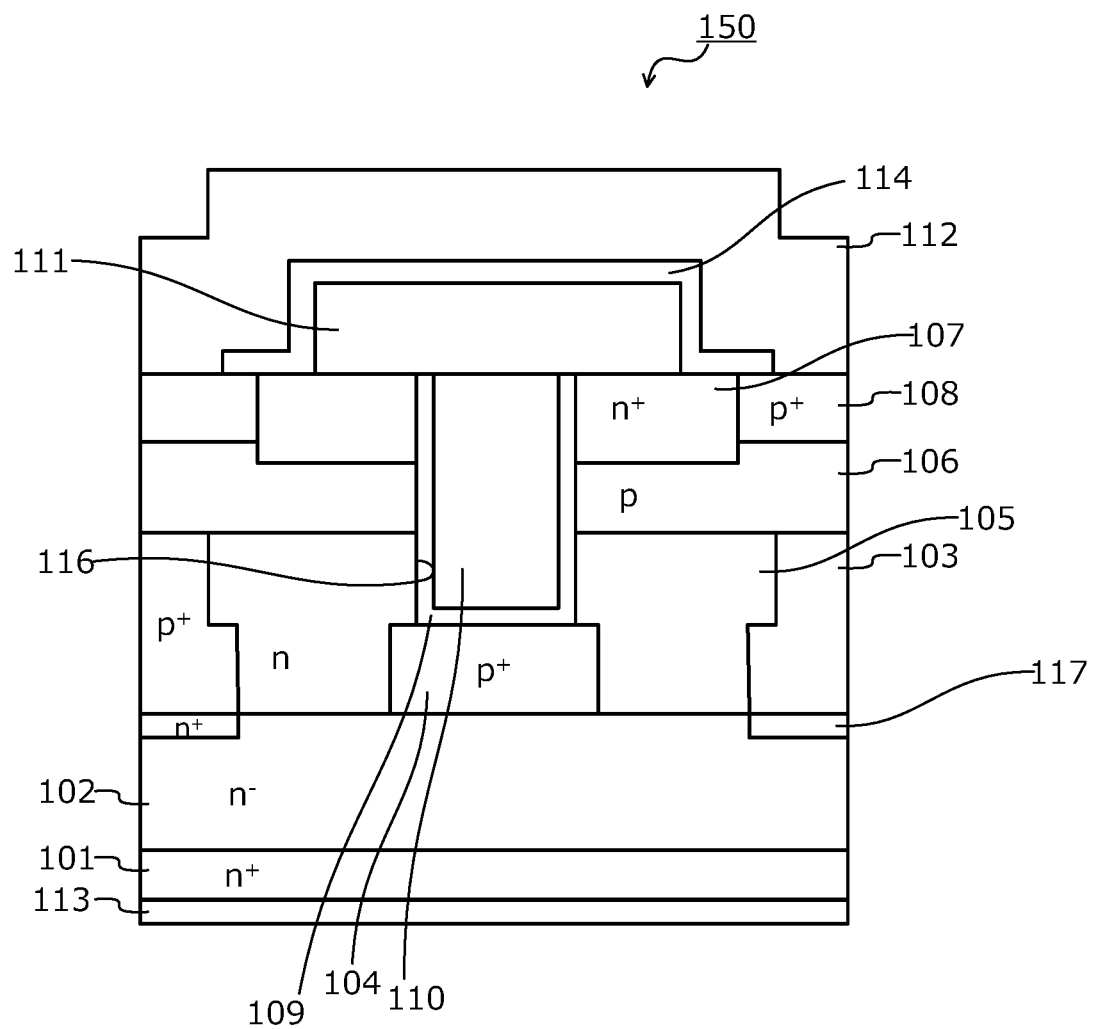
FIG. 9 is a cross-sectional view of a structure of a conventional trench-type silicon carbide semiconductor device.

Next, for example, a phosphate glass is deposited to have a thickness of about 1 μm and to cover the gate insulating film 9 and the gate electrodes 10, whereby the interlayer insulating film 11 is formed. Next, the barrier metal 14 containing titanium (Ti) or titanium nitride (TiN) or stacked layers of titanium and titanium nitride may be formed so as to cover the interlayer insulating film 11. The interlayer insulating film 11 and the gate insulating film 9 are patterned by photolithography, thereby forming contact holes exposing the $n^+$-type source regions 7 and the $p^+$-type contact regions 8. Thereafter, a heat treatment (reflow) is performed, whereby the interlayer insulating film 11 is planarized. The state up to here is depicted in FIG. 8.

Next, the interlayer insulating film 11 is selectively removed and on the surface of the silicon carbide semiconductor base, a nickel (Ni) or a Ti film is deposited. Next, the surface is protected and on a back side of the $n^+$-type silicon carbide substrate 1, a Ni or a Ti film is deposited. Next, a heat treatment of about 1000 degrees C. is performed, whereby an ohmic electrode is formed on the front side of the silicon carbide semiconductor base and on the back side of the $n^+$-type silicon carbide substrate 1.

Next, a conductive film that forms the source electrode 12 is provided on the interlayer insulating film 11 and is in contact with the $n^+$-type source regions 7 and the $p^+$-type contact regions 8 so as to contact the ohmic electrode portion formed in the contact holes.

Next, the back electrode 13 form by, for example, a nickel (Ni) film is formed on the second main surface of the $n^+$-type silicon carbide substrate 1. Thereafter, for example, a heat treatment of a temperature of about 970 degrees C. is performed, thereby forming an ohmic contact between the $n^+$-type silicon carbide substrate 1 and the back electrode 13.

Next, for example, by sputtering, an electrode pad forming the source electrode pad (not depicted) is deposited on the source electrode 12 on the front surface of the silicon carbide semiconductor base and in the openings of the interlayer insulating film 11. A thickness of a portion of the electrode pad on the interlayer insulating film 11, for example, may be at least 5 μm. The electrode pad, for example, may be formed using aluminum (Al—Si) containing silicon at a ratio of 1 wt %. Next, the source electrode pad is selectively removed.

Next, on the surface of the back electrode 13, for example, titanium (Ti), nickel (Ni), and gold (Au) are sequentially deposited as the drain electrode pad (not depicted). As described above, the semiconductor device depicted in FIG. 1 is completed.

As described above, according to the silicon carbide semiconductor device according to the embodiment, in the second $p^+$-type base regions, the curvature of the respective surfaces thereof facing the back electrode is smaller than the curvature of the respective surfaces thereof facing the source electrode. As a result, the outlet side of the current path when the gate is ON and voltage Vds is applied between the drain and the source and current flows may be widened. Therefore, spreading resistance may be reduced, thereby enabling device loss to be reduced.

Further, when the gate is OFF and voltage Vds is applied between the drain and the source, the bottom parts of the second $p^+$-type base regions have no corners and therefore, concentration of electric field at the bottoms of the second $p^+$-type base regions may be mitigated, enabling avalanche breakdown voltage of the second $p^+$-type base regions to be increased. Therefore, the occurrence of avalanche breakdown at the bottoms of the trenches and destruction of the gate insulating film at the bottoms of the trenches may be prevented.

Further, the silicon carbide semiconductor device according to the embodiment is targeted at mainly MOSFETs having a breakdown voltage in a range from 1200V to 1700V and for silicon carbide semiconductor devices in which the width of the trenches 16 is about 0.7 μm and the width w2 of the second p$^+$-type base regions 4 is 0.8 μm or less, the effects are remarkable.

Various modifications within a range not departing from the spirit of the present invention are possible. In the embodiments, for example, dimensions and impurity concentrations of parts may be variously set according to necessary specifications. Further, in the embodiments, while description is given taking, as an example, a case in which silicon carbide is used as a wide bandgap semiconductor, another wide bandgap semiconductor other than silicon carbide, for example, gallium nitride (GaN) is applicable. Further, in the embodiments, while the first conductivity type is assumed to be an n-type and the second conductivity type is assumed to be a p-type, the present invention is similarly implemented when the first conductivity type is a p-type and the second conductivity type is an n-type.

According to the invention described above, in the second p$^+$-type base regions (the second bases region of the second conductivity type), the curvature of the respective surfaces thereof facing the back electrode (second electrode) is smaller than the curvature of the respective surfaces thereof facing the source electrode (first electrode). As a result, the outlet side of the current path when the gate is ON and voltage Vds is applied between the drain and the source and current flows may be widened. Therefore, spreading resistance may be reduced, thereby enabling device loss to be reduced.

Further, when the gate is OFF and voltage Vds is applied between the drain and the source, the bottom parts of the second p$^+$-type base regions have no corners and therefore, concentration of electric field at the bottoms of the second p$^+$-type base regions may be mitigated, enabling avalanche breakdown voltage of the second p$^+$-type base regions to be increased. Therefore, the occurrence of avalanche breakdown at the bottoms of the trenches and destruction of the gate insulating film at the bottoms of the trenches may be prevented.

The semiconductor device according to the present invention achieves an effect in that device loss is reduced and avalanche breakdown voltage at the bottoms of the p$^+$-type base regions may be increased.

As described above, the semiconductor device according to the present invention is useful for power semiconductor devices used in power converting equipment such as inverters, power source devices such as in various types of industrial machines, and igniters of automobiles.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
a semiconductor substrate of a first conductivity type;
a first semiconductor layer of the first conductivity type, provided on a front surface of the semiconductor substrate, and having an impurity concentration lower than an impurity concentration of the semiconductor substrate, the first semiconductor layer having a first surface and a second surface that is opposite to the first side and faces the front surface of the semiconductor substrate;
a second semiconductor layer of a second conductivity type, provided on the first surface of the first semiconductor layer;
a first semiconductor region of the first conductivity type, selectively provided in a surface layer of the second semiconductor layer;
a plurality of trenches penetrating the first semiconductor region and the second semiconductor layer, and reaching the first semiconductor layer;
a plurality of gate electrodes each provided in a corresponding trench of the plurality of trenches, via a gate insulating film;
a first base region of the second conductivity type, provided in the first semiconductor layer, between adjacent trenches of the plurality of trenches, the first base region being in contact with the second semiconductor layer;
a plurality of second base regions of the second conductivity type, provided in the first semiconductor layer, second base regions of the plurality of second base regions facing trenches of the plurality of trenches, respectively, in a depth direction;
a first electrode in contact with the first semiconductor region and the second semiconductor layer; and
a second electrode provided on a back surface of the semiconductor substrate, wherein
each of the plurality of second base regions has a first surface facing the second electrode and a second surface facing the first electrode, and a curvature of the first surface is smaller than a curvature of the second surface.

2. The semiconductor device according to claim 1, wherein
a depth of a portion of the first base region where a width of the first base region is greatest and a depth of a portion of each of the plurality of second base regions where a width of each of the plurality of second base regions is greatest, are equal.

3. The semiconductor device according to claim 1, wherein
a distance between the second surface of one of the plurality of second base regions and the second semiconductor layer is less than a distance between the first base region and the one of the plurality of second base regions.

4. The semiconductor device according to claim 1, wherein
the first base region has a surface that faces the second electrode, and the curvature of the first surface of each of the plurality of second base regions is smaller than a curvature of the surface of the first base region.

5. The semiconductor device according to claim 1, further comprising
a third semiconductor layer of the first conductivity type, provided in a surface layer of the first semiconductor layer, and having an impurity concentration that is higher than the impurity concentration of the first semiconductor layer, wherein
the third semiconductor layer includes a first third semiconductor layer that is deeper than the second surface of the each of the plurality of second base regions and a second third semiconductor layer that is shallower than the first surface of each of the plurality of second base regions, and the second third semiconductor layer has an impurity concentration that is lower than an impurity concentration of the first third semiconductor layer.

6. The semiconductor device according to claim 1, further comprising a third semiconductor layer of the first conductivity type, provided in a surface layer of the first semiconductor layer, and having an impurity concentration that is higher than the impurity concentration of the first semiconductor layer, wherein the third semiconductor layer includes a first third semiconductor layer that is deeper than the second surface of the each of the plurality of second base regions and a second third semiconductor layer that is shallower than the first surface of each of the plurality of second base regions, and the first third semiconductor layer has an impurity concentration that is equal to an impurity concentration of the second third semiconductor layer.

\* \* \* \* \*